United States Patent
Tachi et al.

(10) Patent No.: US 8,128,790 B2
(45) Date of Patent: Mar. 6, 2012

(54) PLATING APPARATUS AND PLATING METHOD

(75) Inventors: Yasuaki Tachi, Gifu (JP); Shigeki Sawa, Gifu (JP); Toshiyuki Kasuga, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 330 days.

(21) Appl. No.: 12/182,745

(22) Filed: Jul. 30, 2008

(65) Prior Publication Data

US 2009/0032404 A1 Feb. 5, 2009

Related U.S. Application Data

(63) Continuation of application No. PCT/JP2007/051275, filed on Jan. 26, 2007.

(30) Foreign Application Priority Data

Jan. 30, 2006 (JP) ................................. 2006-020922

(51) Int. Cl.
*C25D 17/00* (2006.01)

(52) U.S. Cl. ........................................ 204/202; 204/206

(58) Field of Classification Search .................. 204/199, 204/202, 206; 205/137, 138
See application file for complete search history.

(56) References Cited

U.S. PATENT DOCUMENTS

| | | | |
|---|---|---|---|
| 4,073,699 A * | 2/1978 | Hutkin | ............................ 205/50 |
| 4,964,948 A | 10/1990 | Reed | |
| 5,229,549 A | 7/1993 | Yamakawa et al. | |
| 5,440,075 A | 8/1995 | Kawakita et al. | |
| 6,534,116 B2 | 3/2003 | Basol | |
| 6,607,652 B2 | 8/2003 | Webb et al. | |
| 6,802,761 B1 | 10/2004 | Beaucage et al. | |
| 6,863,209 B2 | 3/2005 | Rinne et al. | |
| 7,160,428 B2 * | 1/2007 | Fujimoto | ...................... 205/134 |
| 7,163,613 B2 * | 1/2007 | Hashimoto | ...................... 205/95 |
| 2002/0020620 A1 | 2/2002 | Webb et al. | |
| 2003/0064669 A1 | 4/2003 | Basol et al. | |
| 2004/0185753 A1 | 9/2004 | Beaucage et al. | |
| 2006/0065534 A1 | 3/2006 | Nakai et al. | |

FOREIGN PATENT DOCUMENTS

| | | |
|---|---|---|
| JP | 57-057896 A | 4/1982 |
| JP | 58-6999 A | 1/1983 |
| JP | 63-270497 A | 11/1988 |
| JP | 63-297588 A | 12/1988 |
| JP | 05-230691 A | 9/1993 |

(Continued)

*Primary Examiner* — Luan Van
(74) *Attorney, Agent, or Firm* — Oblon, Spivak, McClelland, Maier & Neustadt, L.L.P.

(57) ABSTRACT

An apparatus that performs an electrolytic plating on a plating surface of a belt substrate is provided. The apparatus includes a plating tank, a conveyor device configured to carry a belt substrate through an interior of the plating tank, an immersed cathode power-supply section provided within the interior of the plating tank, an auxiliary cathode power-supply section provided within the interior of the plating tank, and short-circuit wiring configured to short-circuit the immersed cathode power-supply section to the auxiliary cathode power-supply section. A plating method for performing electrolytic plating on a plating surface of a belt substrate is provided. The method includes conveying the belt substrate through a plating tank, making the plating surface a cathode by contacting at least one of an immersed cathode power-supply section or an auxiliary cathode power-supply section with the belt substrate, and short-circuiting the immersed cathode power-supply section to the auxiliary cathode power-supply section.

9 Claims, 9 Drawing Sheets

FOREIGN PATENT DOCUMENTS

| | | | |
|---|---|---|---|
| JP | 05230691 A * | 9/1993 | |
| JP | 6-146066 A | 5/1994 | |
| JP | 7-180092 A | 7/1995 | |
| JP | 08-144086 A | 6/1996 | |
| JP | 9-130050 | 5/1997 | |
| JP | 2000-232078 | 8/2000 | |
| JP | 2000-239892 A | 9/2000 | |
| JP | 2002-47594 A | 2/2002 | |
| JP | 2003-183883 | 7/2003 | |
| JP | 2004-225119 | 8/2004 | |
| JP | 2005-113173 A | 4/2005 | |
| JP | 2005-511881 | 4/2005 | |
| JP | 2005-520044 A | 7/2005 | |
| WO | WO 03-009361 | 1/2003 | |
| WO | WO 03-028048 | 4/2003 | |
| WO | WO 2006-033315 | 3/2006 | |

* cited by examiner

FIG. 9

|  | degree of concavity at via holes in lower-layer substrate (μm) | results in heat-cycle test |
|---|---|---|
| Example 1 | 5-10 | — |
| Example 2 | 5-10 | — |
| Example 5 | 0-5 | — |
| Example 6 | 0-5 | — |
| Comp. Example 1 | 20-25 | — |
| Example 7 | 5-10 | ○ |
| Example 8 | 5-10 | ○ |
| Example 9 | 0-5 | ○ |
| Example 10 | 0-5 | ○ |
| Comp. Example 2 | 0-25 | × |

PLATING APPARATUS AND PLATING METHOD

RELATED APPLICATIONS

The present application is a continuation of PCT/JP2007/051275, filed Jan. 26, 2007, which claims benefit of and priority to Japanese Patent Application No. 2006-020922, filed on Jan. 30, 2006, the entire contents of each of which are incorporated hereinto by reference.

TECHNICAL FIELD

A plating apparatus and associated method to conduct through-hole plating and via-hole plating so as to achieve uniform plated films and filling performance when plating the interiors of non-through-holes and through-holes are provided.

DESCRIPTION OF RELATED ART

Japanese Laid-Open Patent Application 2000-239892 describes a plating apparatus having a plating tank, an advancing device to advance a belt substrate into the plating tank; a bottom turning device formed in the plating tank to turn upward the descending continuous belt; a descending plating zone to plate the belt substrate descending toward the bottom turning device; a non-plating zone to pass the belt substrate ascending from the bottom turning device without applying plating; and a pulling-out device to pull out the belt substrate from the plating tank right after it passes the non-plating zone.

SUMMARY OF THE INVENTION

In one exemplary aspect, an apparatus configured to perform an electrolytic plating on a plating surface of a belt substrate includes a plating tank, a conveyor device configured to carry a belt substrate through an interior of the plating tank, an immersed cathode power-supply section provided within the interior of the plating tank, an auxiliary cathode power-supply section provided within the interior of the plating tank, and short-circuit wiring configured to short-circuit the immersed cathode power-supply section to the auxiliary cathode power-supply section.

In another exemplary aspect, a plating method for performing electrolytic plating on a plating surface of a belt substrate includes the steps of conveying the belt substrate through a plating tank, making the plating surface a cathode by contacting at least one of an immersed cathode power-supply section or an auxiliary cathode power-supply section with the belt substrate, and short-circuiting the immersed cathode power-supply section to the auxiliary cathode power-supply section.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 9 is a chart to show the evaluation results of the Examples and a Comparative Example.

DETAILED DESCRIPTION

Figure 1:
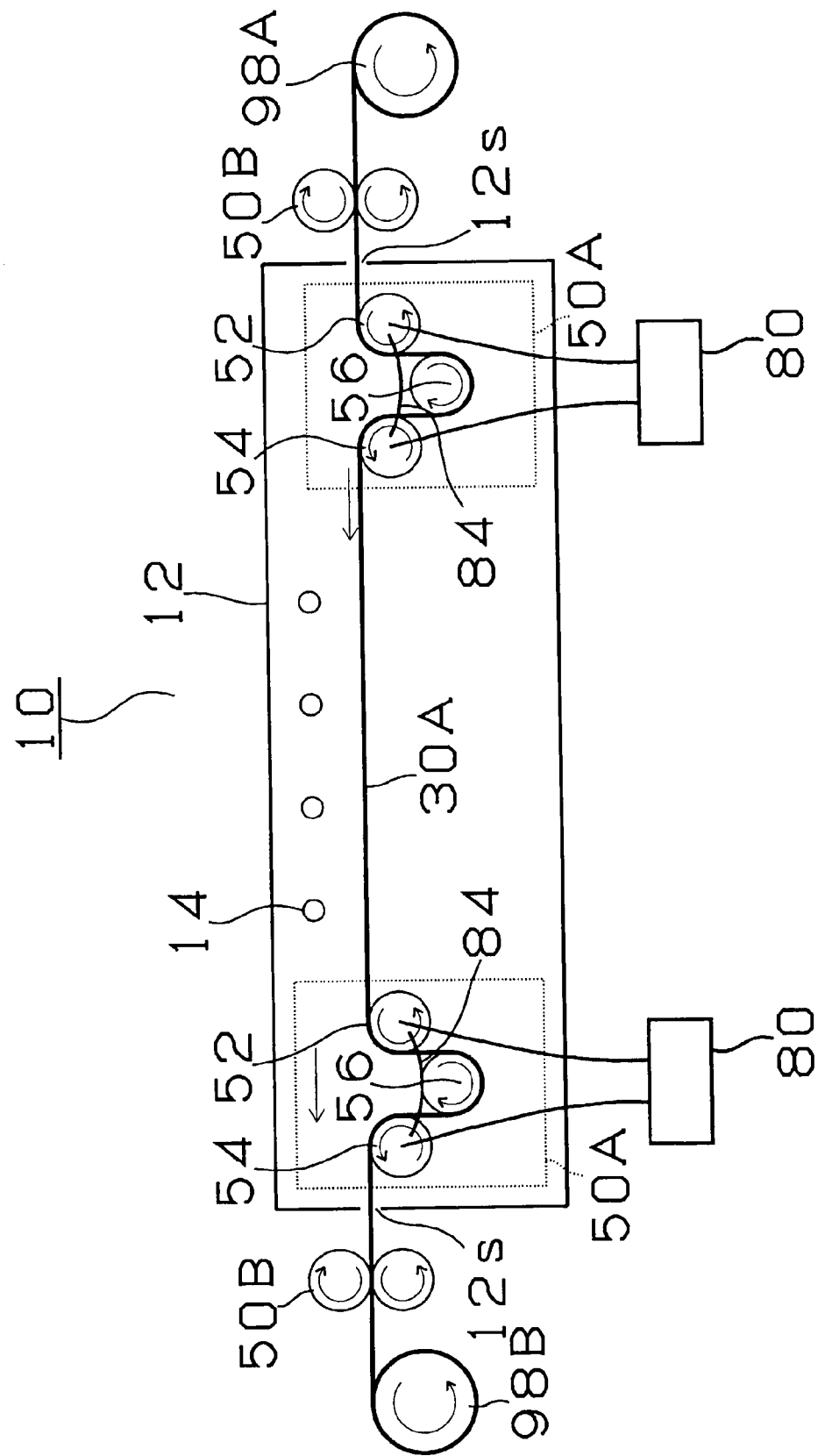
FIG. 1 is a view illustrating a structure of a conveyor mechanism in a plating tank according to first exemplary aspect of the present invention (Example 1).

In the conventional art, since a cathode power-supply roller is positioned outside the solution, a longer plating tank is required. Also, since the substrate is pulled out of the plating solution, occasionally problems occur, such as the plating speed at the interiors of via holes or through-holes slowing down, or the plating speed differing at each interior of via holes and through-holes.

Therefore, one object of the present invention is to provide a plating apparatus and a plating method, such that when a cathode power-supply section is arranged in a plating tank, plating seldom is extracted onto the cathode power-supply section. Another object of the present invention is to provide a plating apparatus and a plating method, such that if a cathode power-supply section is arranged in a plating solution, damage to a belt substrate, such as dents caused at the cathode power-supply section, is reduced; and to suggest a plating apparatus and a plating method, such that the filling performance of plating in the interiors of through-holes and via holes is excellent and the plating thickness is uniform.

As an example, a cathode power-supply section (an immersed cathode power-supply section) is arranged in a plating solution; and an auxiliary cathode section is connected by short-circuit wiring to the immersed cathode power-supply section is further arranged to provide electricity to a plating surface through the cathode power-supply section.

According to the present invention, using a cathode power-supply section of at least either an immersed cathode power-supply section or an auxiliary cathode power-supply section short-circuited by short-circuit wiring, electricity for a plating surface of a belt substrate is provided. Therefore, if an insulation tape connecting belt substrates touches either the immersed cathode power-supply section or the auxiliary cathode power-supply section, and the electricity from the power-supply section with which the insulation tape is in contact is blocked; or, due to a loose belt, if the belt substrate is separated from either the immersed cathode power-supply section or the auxiliary cathode power-supply section, and the electricity from the separated power-supply section is blocked, the other immersed cathode power-supply section or the auxiliary cathode power-supply section remains in contact with the plating surface of the belt substrate to supply electricity.

Therefore, electrical potential among the immersed cathode power-supply section, the auxiliary cathode power-supply section and the belt substrate will not differ. Accordingly, on the surfaces of the immersed cathode power-supply section and the auxiliary cathode power-supply section, electrolytic plated films are seldom extracted. Thus, the need for maintenance on the cathode power-supply section arranged in the plating tank (including the auxiliary cathode power-supply section in the plating solution) may be practically eliminated.

Also, since the cathode power-supply section is arranged in the plating tank, the number of power-supply points outside the plating tank may be reduced. Accordingly, the length of the plating tank may be shortened. In addition, from start to finish of the plating, the number of times the substrate is pulled out of the plating tank may be reduced. Thus, the filling performance in the interiors of non-through-holes and through-holes is enhanced. From start to finish of the plating, it is possible to arrange all the power-supply sections in the plating solution. By arranging such, pulling the belt substrate out of the plating tank is not required until the plating is finished. Consequently, the length of the plating tank is further shortened, the filling performance of the plating in through-holes and non-through-holes is improved, and the degree of filling at each through-hole and non-through-hole becomes more uniform.

Either the immersed cathode power-supply section or the auxiliary cathode power-supply section may have a conveyor mechanism to carry the belt substrate. Also, it is sufficient if at least either the immersed cathode power-supply section or the auxiliary cathode power-supply section is in contact with the belt substrate, because either the immersed cathode power-supply section or the auxiliary cathode power-supply section may provide electricity for the plating surface. If the contact between either one of the cathode sections and the belt substrate is degraded, through short-circuit wiring electrical continuity is maintained from the immersed cathode power-supply section and the auxiliary cathode power-supply section to the plating surface. Thus, at the immersed cathode power-supply section, plating is seldom extracted. As a result, the cathode power-supply section is allowed to be arranged in the plating solution, thus, the number of times the plating substrate is required to be pulled out of the solution is reduced or eliminated. Consequently, the length of the plating tank may be shortened, the filling performance in non-through-holes and through-holes may be enhanced, and the dispersion of the degree of filling may become smaller.

EXAMPLE 1

First, referring to FIG. 1, the structure of a plating apparatus according to Example 1 of the present invention is described. FIG. 1 is a view illustrating the entire structure of the plating apparatus according to Example 1. Plating apparatus 10 conducts plating on a belt substrate to be used in flexible printed wiring boards. On one surface of belt substrate (30A) pulled out of reel (98A), on which a belt substrate 180 millimeters wide and 120 meters long is wound, electrolytic plating is performed, then the substrate is wound back to take-up reel (98B). Plating apparatus 10 has immersed power-supply auxiliary driver (50A) to convey belt substrate (30A) through plating tank 12 as well as to supply electricity; aired power-supply auxiliary driver (50B) to convey belt substrate (30A) in the air as well as to supply electricity; and anodes 14 to supply electricity for the plating solution. Inside anodes 14, copper balls to replenish a copper ingredient for the plating solution are contained. In plating tank 12, two immersed power-supply auxiliary drivers (50A) are arranged to structure a plating line a total of 20 meters long. Here, immersed power-supply auxiliary driver (50A) is structured with immersed cathode power-supply roller (power-supply section) 52 and auxiliary cathode power-supply roller (power-supply section) 54. Immersed cathode power-supply roller 52 and auxiliary cathode power-supply roller 54 are positioned, not facing anodes 14 but facing the non-plating surface of the belt substrate. Facing the plating surface of the belt substrate, insulative roller 56 is positioned.

In immersed power-supply auxiliary driver (50A), immersed cathode power-supply section 52 and auxiliary cathode power-supply section 54 are both formed with conductive stainless steel and connected to rectifiers (80, 80) that supply electric current through power-supply lines (82, 82) respectively. Rectifiers (80, 80) adjust the voltage to a required electric current value. Furthermore, between immersed cathode power-supply section 52 and auxiliary cathode power-supply section 54 in immersed power-supply auxiliary driver (50A), short-circuit wiring 84 is provided. Here, in immersed cathode power-supply section 52, auxiliary drive motor 68 is installed to convey belt substrate (30A) at a predetermined feed rate; and auxiliary cathode power-supply section 54 rolls according to the conveyed belt substrate (30A). In Example 1, electricity is supplied for immersed cathode power-supply section 52 and auxiliary cathode power-supply section 54 from a unit of rectifier 80, but electricity may be supplied by installing rectifier 80 on each section. Also, as for material to form immersed cathode power-supply section 52, it is not limited to stainless steel, but, for example, conductive material such as copper, brass, or iron may be used.

According to the plating apparatus in Example 1, through at least either immersed cathode power-supply section 52 or auxiliary cathode power-supply section 54 electrically connected by short-circuit wiring 84, electricity may be provided for the plating surface of belt substrate (30A). Therefore, if the insulation tape at a seam of the belt substrate or the insulation tape laminated on the belt substrate makes contact with either immersed cathode power-supply section 52 or auxiliary cathode power-supply section 54, and power supply is blocked; or if immersed cathode power-supply section 52 is tilted, the belt substrate is stretched differently at its top and bottom portions, or the tension of the belt substrate becomes loose, causing belt substrate (30A) to be separated from either immersed cathode power-supply section 52 or auxiliary cathode power-supply section 54, and thus power supply is blocked, the other auxiliary cathode power-supply section 54 or immersed cathode power-supply section 52 stays in contact with the plating surface of belt substrate (30A) to supply power. Therefore, electrical potential will not differ among immersed cathode power-supply section 52, auxiliary cathode power-supply section 54 and belt substrate (30A), and thus electrolytic plating films will not be extracted onto the surfaces of immersed cathode power-supply section 52 and auxiliary cathode power-supply section 54. Accordingly, defect-causing trouble such as plated films that are peeled from immersed cathode power-supply section 52 and auxiliary cathode power-supply section 54 and are transferred onto belt substrate (30A) will not occur, and the quality of filled vias may be improved. In addition, the need for maintenance on immersed cathode power-supply section 52 and auxiliary cathode power-supply section 54 arranged in the plating tank may be practically eliminated.

Also, according to the plating apparatus of Example 1, since immersed cathode power-supply roller 52 and auxiliary cathode power-supply roller 54 are arranged on the non-plating surface side, and thus the substrate blocks electric current, plating is seldom extracted onto the power supply rollers. In Example 1, a roller positioned on the plating surface side is formed as insulative roller 56. However, if anodes 14 are moved away to where plating is substantially not extracted, a metal roller instead of an insulative roller may be used.

Also, since immersed cathode power-supply section 52 is immersed in plating tank 12 (in the plating solution) to supply power, plating may be performed without pulling the substrate out of the solution until the plating is completed. Accordingly, the degree of concavity at filled vias may be made 10 μm or less, and the difference of the degree of concavity at each filled via may be made 7 μm or less.

Figure 3:
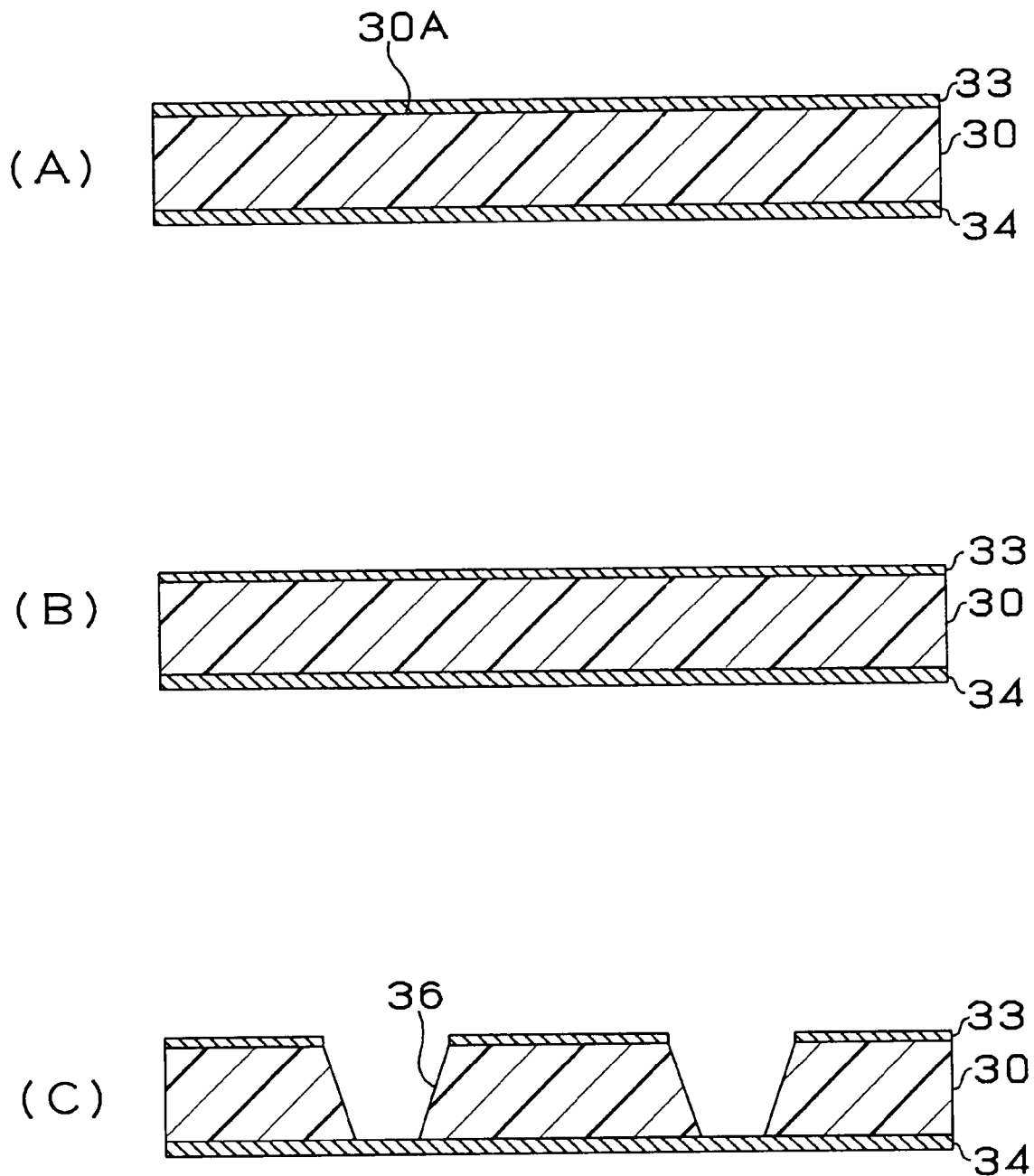
FIGS. 3A-C are views illustrating the manufacturing steps of a flexible printed wiring board using the plating apparatus according to Example 1.
Figure 4:
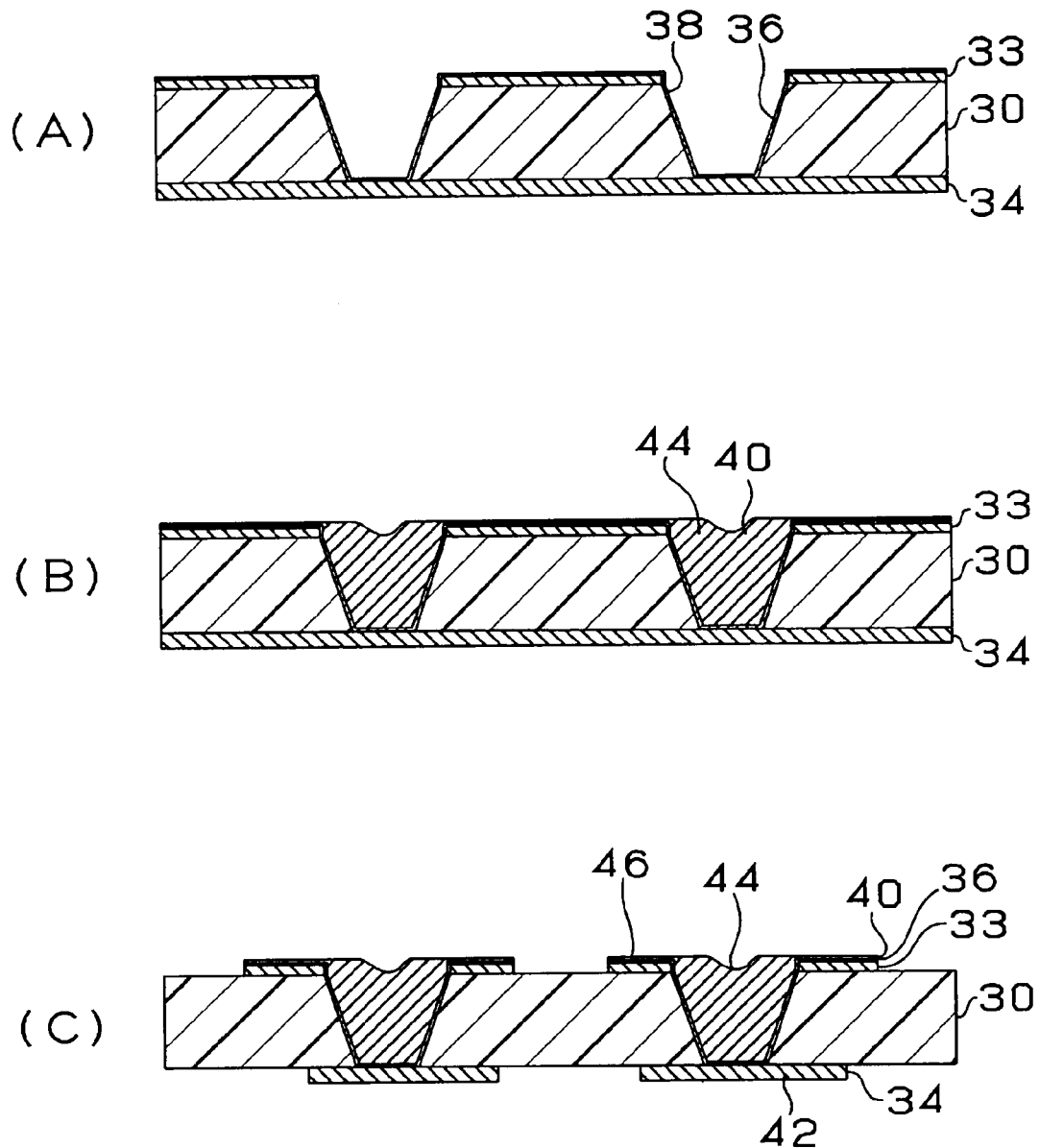
FIGS. 4A-C are views illustrating the manufacturing steps of a flexible printed wiring board using the plating apparatus according to Example 1.

In the following, manufacturing a printed wiring board using the plating apparatus of Example 1 is described with reference to FIGS. 3 and 4. Laminated belt substrate (30A) was prepared as a starting material, where on the surface of 25 μm-thick polyimide belt substrate 30, 9 μm-thick copper foil 33 is laminated, and on the back surface, 12 μm-thick copper foil 34 is laminated (FIG. 3(A)). First, by light etching, the thickness of 9 μm-thick copper foil 33 was adjusted to 7 μm (FIG. 3(B)). Next, using a laser, openings 36, which penetrate copper foil 33 and polyimide belt substrate 30 and reach the back surface of copper foil 34, were bored (FIG. 3(C)). Then, on the surface of belt substrate (30A), by applying a palladium catalyst, catalytic nuclei were adhered (not shown in the drawing). Here, when processing with a laser, it is preferred to conduct a publicly-known black oxide treatment.

Next, in an electroless plating solution (Thrucup PEA) made by C. Uyemura & Co., Ltd., the substrate with adhered catalyst was immersed and on the plating surface of belt substrate (30A), 1.0 μm-thick electroless copper-plated film 38 was formed (FIG. 4(A)).

Then, belt substrate (30A) was washed with 50° C. water to remove grease, washed with 25° C. water, and further washed with sulfuric acid. After that, using plating apparatus 10 described above with reference to FIG. 1, electrolytic plating was performed under the following conditions to form electrolytic plated film 40 (FIG. 4(B)).

| [electrolytic plating solution] | |
|---|---|
| sulfuric acid | 2.24 mol/l |
| copper sulfate | 0.26 mol/l |
| additive | 19.5 ml/l |
| leveling agent | 50 mg/l |
| polishing agent | 50 mg/l |
| [electrolytic plating conditions] | |
| current density | 1 A/dm$^2$ |
| time | 65 minutes |
| temperature | 22 ± 2° C. |

In Example 1, electrolytic plated film 40 was formed to make filled vias 44 in openings 36 with the degree of concavity in the range of 5-10 μm and the difference of the degree of concavity in each filled via within 5 μm (see FIG. 4(C) for the degree of concavity).

Then, a resist with a predetermined pattern was formed, and etched to form conductive circuit 46 and conductive circuit 42 (FIG. 4(C)).

EXAMPLE 2

Figure 2:
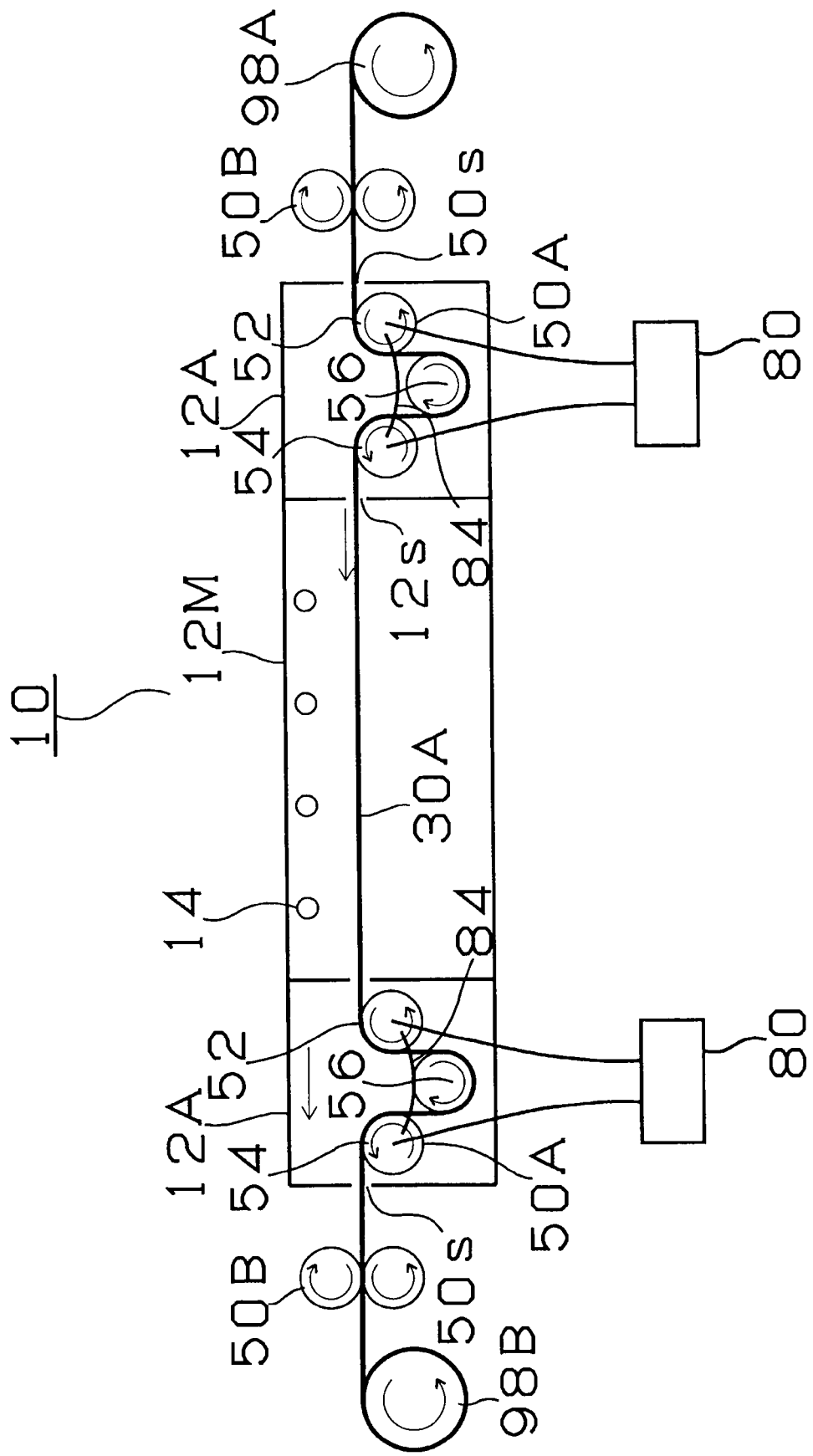
FIG. 2 is a view illustrating a structure of a conveyor mechanism in a plating tank according to a second exemplary aspect of the present invention (Example 2).

In the following, the structure of a plating apparatus according to Example 2 of the present invention is described with reference to FIG. 2. According to the plating apparatus in Example 2, a plating tank is structured with main tank (12M) and auxiliary tanks (12A). Main tank (12M) and auxiliary tanks (12A) are connected with slits (12s) wide enough for belt substrate (30A) to pass through. In main tank (12M), anodes 14 are arranged, and in auxiliary tanks (12A), immersed power supply auxiliary drivers (50A) are arranged.

According to the plating apparatus in Example 2, anodes 14 and cathode power-supply rollers (52, 54) are each arranged separately in main tank (12M) and auxiliary tanks (12A), and main tank (12M) and auxiliary tanks (12A) are connected only with narrow slits (12s). Thus, on cathode power-supply rollers (52, 54), plating is seldom extracted. Even with such a tank structure, since main tank (12M) and auxiliary tanks (12A) are connected with slit (12s), belt substrate is kept immersed in the plating solution until the plating is finished. Therefore, the degree of concavity of filled vias may be made 10 μm or less, and the dispersion of the degree of concavity among filled vias may be made 7 μm or less. In Example 2, using the plating apparatus shown in FIG. 2, the belt substrate was plated. The degree of concavity of filled vias and the difference of the degree of concavity among filled vias were the same as in Example 1.

EXAMPLE 3

In the following, manufacturing steps according to Example 3 are described with reference to FIGS. 5 and 6. In Example 1 described above with reference to FIG. 1, using plating apparatus 10, filled vias 44 were formed on one surface. In contrast, in Example 3, both surfaces of laminated belt substrate 130 are plated to form through-holes.

Figure 5:
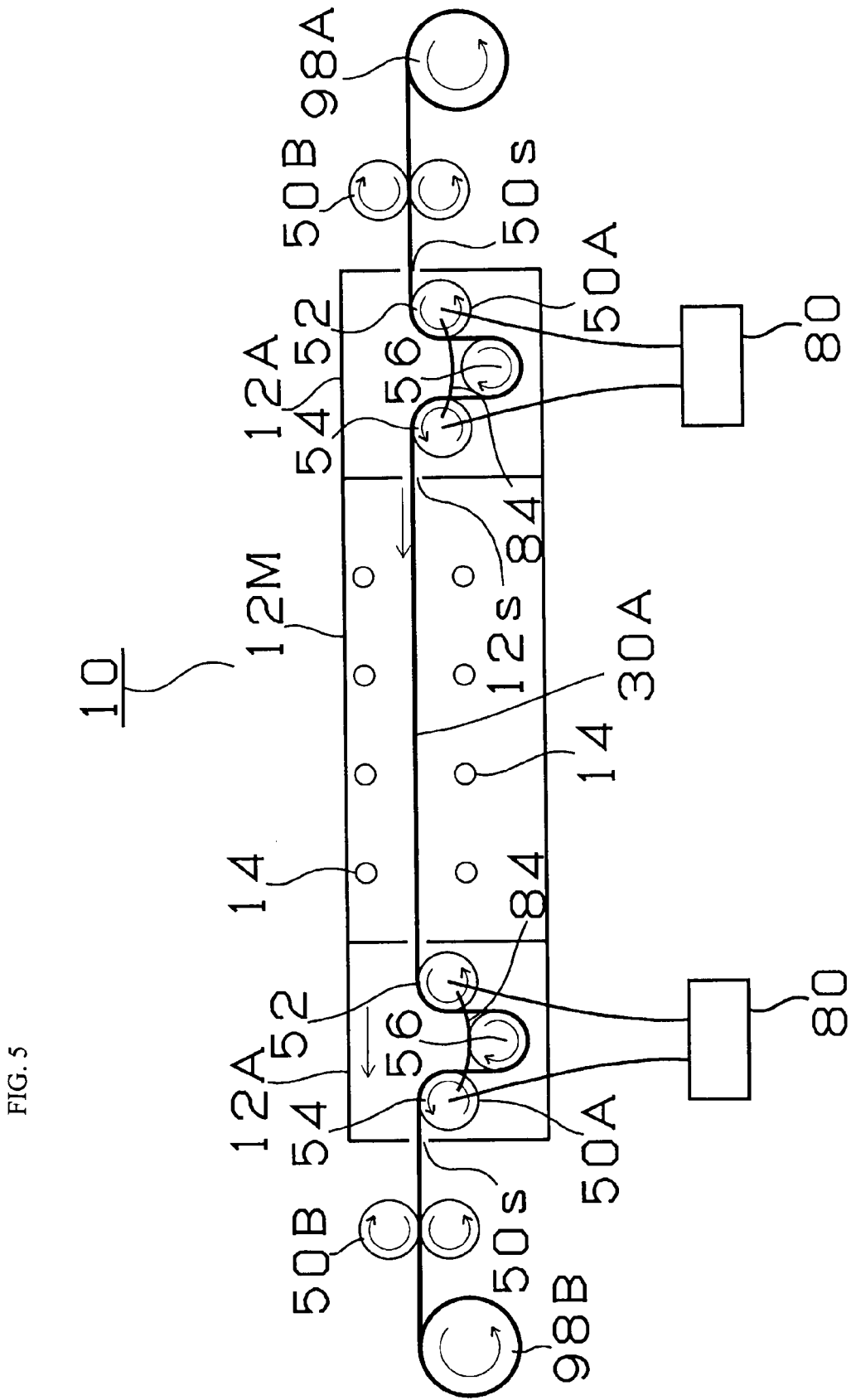
FIG. 5 is a perspective view illustrating the conveyor mechanism in the plating tank of the plating apparatus according to a third exemplary aspect of the present invention (Example 3).
Figure 6:
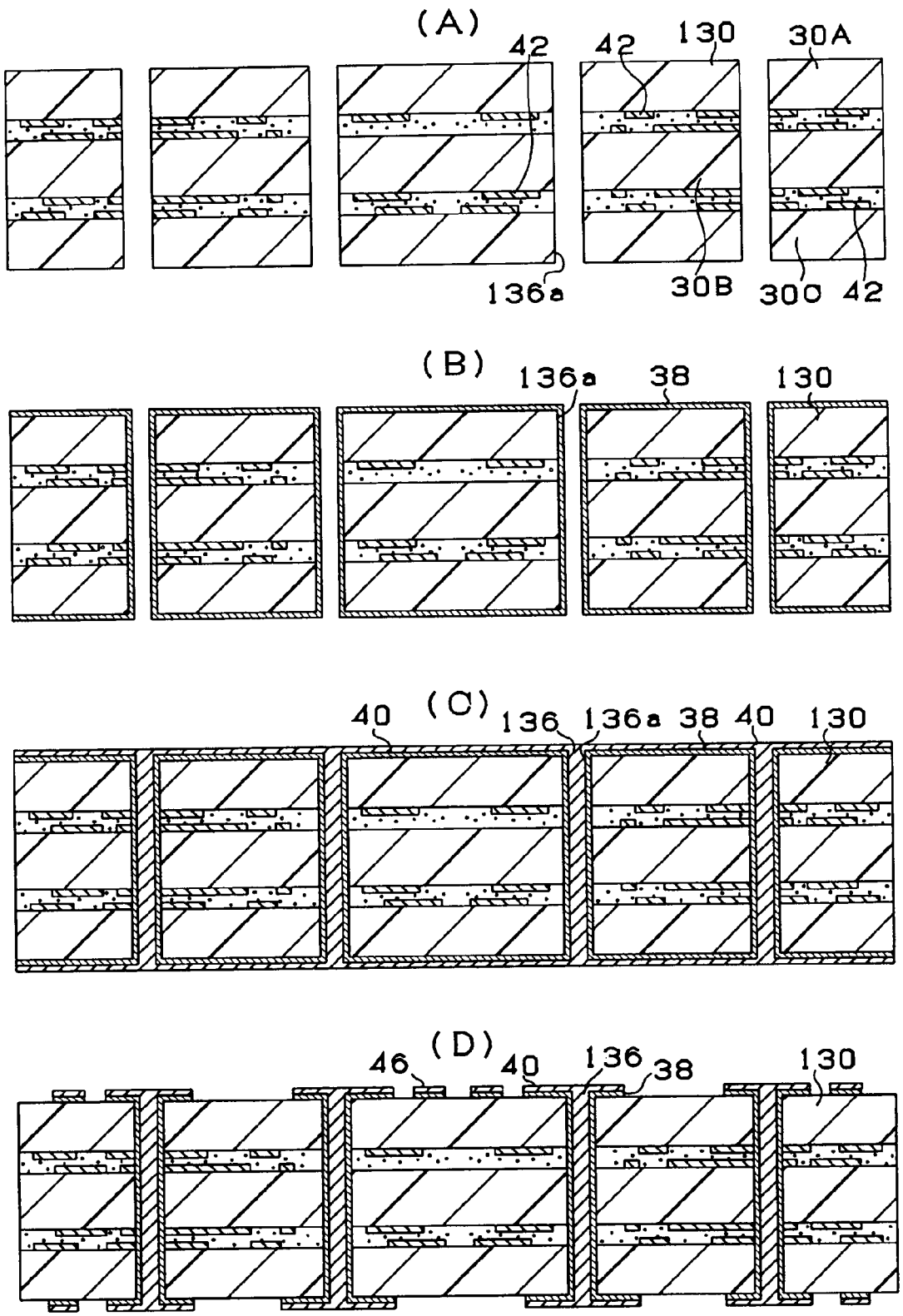
FIGS. 6A-D are views illustrating the manufacturing steps of a flexible printed wiring board using the plating apparatus according to Example 3.

FIG. 5 shows the structure of a plating apparatus according to Example 3. In Example 3, compared with the plating apparatus in Example 2 described above with reference to FIG. 2, anodes 14 are arranged over both surfaces of belt substrate (30A).

(1) First, in laminated substrate 130 which is formed by laminating core belt substrates (30A, 30B, 30C) each having conductive circuit 34, through-hole openings (136a) are bored (FIG. 6(A)).

(2) Next, electroless plated film 38 is formed on the entire laminated substrate 130 and the interiors of through-hole openings (136a) (FIG. 6(B)).

(3) Using the plating apparatus 10 of Example 2 described above with reference to FIG. 5, on the surfaces of laminated substrate 130, electrolytic plated film 40 is formed and the interiors of through-hole openings (136a) are filled with electrolytic plated film 40 (FIG. 6(C)).

(4) After forming etching resist, at the portions where the etching resist is not formed, electrolytic plated film 40 and electroless plated film 38 are removed by etching. Then, the etching resist is dissolved and removed to form independent upper-layer conductive circuit 46 (including through-holes 136). (FIG. 6(D)).

EXAMPLE 4

Figure 7:
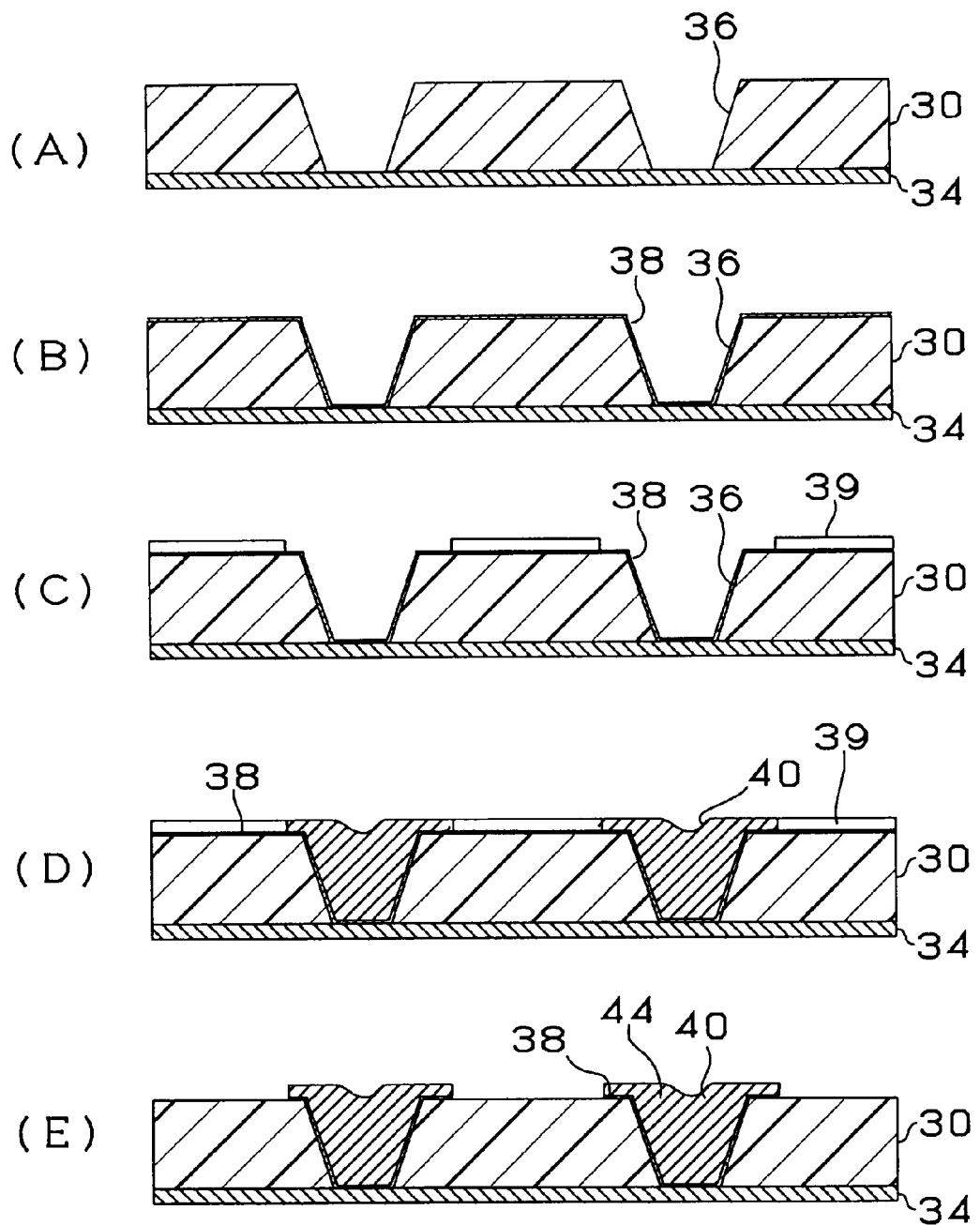
FIGS. 7A-E are views illustrating the manufacturing steps of a flexible printed wiring board using the plating apparatus according to a fourth exemplary aspect of the present invention (Example 4).

In Example 4, a plating resist is formed to form a plated layer. The manufacturing steps are described with reference to FIG. 7

In a laminated substrate formed by laminating copper foil 34 on the back surface of polyimide belt substrate 30, openings 36, which penetrate polyimide belt substrate 30 and reach the back surface of copper foil 34, are bored by a laser (FIG. 7(A)). Then, on the surface of belt substrate (30A), electroless copper-plated film 38 is formed (FIG. 7(B)). After that, resist layer 39 having a predetermined pattern is formed (FIG. 7(C)). Using plating apparatus 10 described above with reference to FIG. 1, electrolytic plating is performed to form electrolytic plated-film 40 (FIG. 7(D)). Lastly, by peeling resist layer 39 and removing electroless copper-plated film 38 underneath resist layer 39, filled-vias 44 are formed (FIG. 7(E)).

EXAMPLE 5

Using the plating apparatus of Example 1, by changing the plating conditions such as current density, filled vias 44, where the degree of concavity is in the range of 0-5 µm and the difference of the degree of concavity among filled vias is 5 µm, are formed in openings 36.

EXAMPLE 6

Using the plating apparatus of Example 2, by changing the plating conditions such as current density, filled vias 44, where the degree of concavity is in the range of 0-5 µm and the difference of the degree of concavity among filled vias is 5 µm, are formed in openings 36.

COMPARATIVE EXAMPLE 1

In Comparative Example 1, same as in the conventional art (Japanese Laid-Open Patent Application 2000-239892), plating was performed by positioning all the power-supply rollers outside the solution. Thus, during the plating process, the substrate was pulled out of the plating solution. The degree of concavity was in the range of 0-25 µm and the difference of the degree of concavity among filled vias was 25 µm,

EXAMPLE 7

Figure 8:
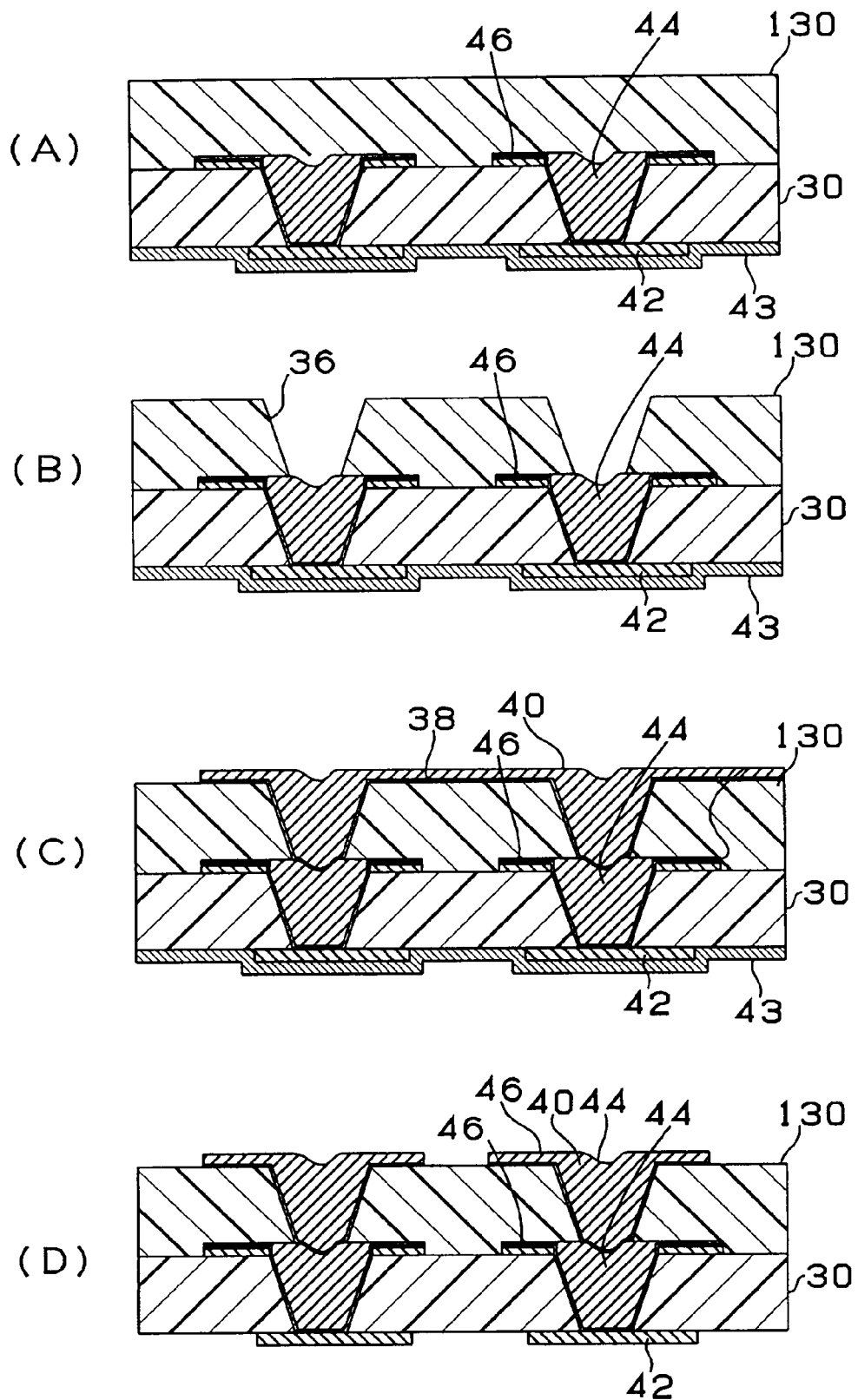
FIGS. 8A-D are views illustrating the manufacturing steps of a flexible printed wiring board according to a seventh exemplary aspect of the present invention (Example 7).

In Example 7, a multilayered printed wiring board was manufactured. The manufacturing method is described with reference to FIG. 8. On filled vias 44 in the substrate of Example 1 (FIG. 4(C): lower-layer substrate), 25 µm-thick epoxy film 130 was laminated, and on conductive circuit 42 formed with copper film 34, aluminum foil 43 to short-circuit each conductive circuit was laminated (FIG. 8(A)). After that, directly on filled vias 44, via holes 36 were formed by a laser (FIG. 8(B)). Then, under the same condition as in Example 1, on the epoxy film and inside the via holes, electroless plated film 38 and electrolytic plated film 40 are formed (FIG. 8(C)). By removing aluminum foil 43 and patterning the plated film on epoxy film 130, via holes 44 and conductive circuit 46 were formed to obtain a multilayered printed wiring board (FIG. 8(D)).

EXAMPLE 8

In Example 8, using the plating apparatus and belt substrate of Example 2, a multilayered printed wiring board was formed as in Example 7.

EXAMPLE 9

In Example 9, using the plating apparatus and belt substrate of Example 5, a multilayered printed wiring board was formed as in Example 7.

EXAMPLE 10

In Example 10, using the plating apparatus and belt substrate of Example 6, a multilayered printed wiring board is formed as in Example 7.

COMPARATIVE EXAMPLE 2

In Comparative Example 2, the substrate used in Example 1 is switched to the one in Comparative Example 1 (conventional art), a multilayered printed wiring board was formed as in Example 6. Here, when forming conductive circuits in Examples 6, 7, 8 and 9 and Comparative Example 2, circuits are formed so as to connect 100 via holes.

[Evaluation Test]

Resistance values of the wirings connecting 100 via holes formed in the multilayered printed wiring boards in Examples 6, 7, 8 and 9, and Comparative Example 2 were measured and set as initial values. Then, a heat cycle (−55° C.×5 minutes× 125° C.×5 minutes) was repeated 1,000 times. After finishing 1,000 cycles, the resistance values were measured again. Then, if the ratio of the change in resistance values ((wiring resistance value after 1,000 cycles−initial wiring resistance value)/initial wiring resistance value×100) is within ±10%, it is considered as passed. The results are shown in FIG. 9.

In the above examples, a plating apparatus used to manufacture via-holes and through-holes is described. However, the plating apparatus according to the examples of the present invention may be suitably applied for manufacturing various sections of a printed wiring board. Also, in the above examples, electrolytic plating is described. However, the structure of the plating apparatus of the present invention may be applied for performing electroless plating.

Obviously, numerous modifications and variations of the present invention are possible in light of the above teachings. It is therefore to be understood that within the scope of the appended claims, the invention may be practiced otherwise than as specifically described herein.

The invention claimed is:

1. An apparatus for performing an electrolytic plating on a plating surface of a belt substrate, comprising:
   a plating tank;
   a conveyor device configured to carry a belt substrate through an interior of the plating tank;
   an auxiliary driver device positioned in an interior of the plating tank and configured to convey the belt substrate, the auxiliary driver device comprising an immersed cathode power-supply roller, an auxiliary cathode power-supply roller and a short-circuit wiring configured to short-circuit the immersed cathode power-supply roller to the auxiliary cathode power-supply roller,
   wherein at least one of the immersed cathode power-supply roller and the auxiliary cathode power-supply roller maintains electrical continuity with a plating surface of the belt substrate, the immersed cathode power-supply roller and the auxiliary cathode power-supply roller are positioned on a non-plating surface side inside the plating tank, one of the immersed cathode power-supply roller and the auxiliary cathode power-supply roller is a drive roller, and the other one of the immersed cathode power-supply roller and the auxiliary cathode power-supply roller is a dependent roller which rotates according to the drive roller.

2. The plating apparatus according to claim 1, further comprising a plurality of anodes provided within the interior of the plating tank, wherein the immersed cathode power-supply roller and the auxiliary cathode power-supply roller are arranged so as not to face the anodes.

3. The plating apparatus according to claim 1, wherein the plating tank is structured with a main tank where anodes are arranged, and an auxiliary tank where the immersed cathode power-supply roller and the auxiliary cathode power-supply roller are arranged, and the main tank and the auxiliary tank are connected with a slit for the belt substrate to pass through.

4. The plating apparatus according to claim 1, wherein the immersed cathode power-supply roller and the auxiliary cathode power-supply roller are conductive rollers.

5. The plating apparatus according to claim 2, wherein the immersed cathode power-supply roller and the auxiliary cathode power-supply roller are conductive rollers.

6. The plating apparatus according to claim 3, wherein the immersed cathode power-supply roller and the auxiliary cathode power-supply roller are conductive rollers.

7. The plating apparatus according to claim 1, further comprising:
   a plurality of anodes provided within the interior of the plating tank; and
   a second auxiliary driver device positioned in an interior of the plating tank and configured to convey the belt substrate, the second auxiliary driver device comprising an immersed cathode power-supply roller, an auxiliary cathode power-supply roller and a short-circuit wiring configured to short-circuit the immersed cathode power-supply roller of the second auxiliary driver device to the auxiliary cathode power-supply roller of the second auxiliary driver device,
   wherein the auxiliary driver device and the second auxiliary driver device are positioned on opposite ends of the plurality of anodes.

8. The plating apparatus according to claim 1, further comprising:
   a plurality of anodes provided within the interior of the plating tank; and
   a second auxiliary driver device positioned in an interior of the plating tank and configured to convey the belt substrate, the second auxiliary driver device comprising an immersed cathode power-supply roller, an auxiliary cathode power-supply roller and a short- circuit wiring configured to short-circuit the immersed cathode power-supply roller of the second auxiliary driver device to the auxiliary cathode power-supply roller of the second auxiliary driver device,
   wherein the plating tank is structured with a main tank in which the anodes are positioned and a plurality of auxiliary tanks in which the auxiliary driver device and the second auxiliary driver device are positioned, respectively, and the main tank and the auxiliary tanks are connected with a slit for the belt substrate to pass through.

9. The plating apparatus according to claim 8, wherein the auxiliary tanks are positioned on opposite ends of the main tank, respectively.

* * * * *